United States Patent [19]

Oda

[11] Patent Number: 4,694,476
[45] Date of Patent: Sep. 15, 1987

[54] BURIED CHANNEL CHARGE COUPLED DEVICE

[75] Inventor: Eiji Oda, Tokyo, Japan

[73] Assignee: NEC Corporation, Tokyo, Japan

[21] Appl. No.: 910,343

[22] Filed: Sep. 19, 1986

Related U.S. Application Data

[63] Continuation of Ser. No. 741,942, Jun. 6, 1985, abandoned.

[30] Foreign Application Priority Data

Jun. 6, 1984 [JP] Japan ................................ 59-116073

[51] Int. Cl.$^4$ ...................... G11C 19/28; H01L 29/78; H01L 27/14; H01L 31/00
[52] U.S. Cl. ........................................ 377/58; 357/24; 357/30
[58] Field of Search ................. 357/24, 30; 377/57–63

[56] References Cited

U.S. PATENT DOCUMENTS

| | | | |
|---|---|---|---|
| 3,896,485 | 7/1975 | Early | 357/24 LR |
| 3,996,600 | 12/1976 | Patrin | 357/30 |
| 4,131,810 | 12/1978 | Knaur et al. | 357/24 LR |
| 4,373,167 | 2/1983 | Yamada | 357/30 |
| 4,467,341 | 8/1984 | Suzuki | 357/24 LR |
| 4,527,182 | 7/1985 | Ishihara et al. | 357/24 LR |

FOREIGN PATENT DOCUMENTS 2054961 2/1981 United Kingdom ............. 357/24 M Primary Examiner—Gene M. Munson
Attorney, Agent, or Firm—Burns, Doane, Swecker & Mathis

[57] ABSTRACT

A buried channel CCD is described wherein buried CCD elements are formed on a semiconductor substrate of P-type material and formed in a semiconductor area of N-type material. Transfer electrodes are provided to which a driving pulse is applied. The driving pulse is a three-level pulse having, at different time points, first, second and third levels, during at least one part of a time period in a charge transfer period and a charge integration period, the first or second level of the three-level pulse is applied to selected transfer electrodes so that part of signal charges in the buried channel are drained through the semiconductor area into the semiconductor substrate; and in the charge transfer period, the second and third levels are alternately applied to the transfer electrodes.

7 Claims, 5 Drawing Figures

BURIED CHANNEL CHARGE COUPLED DEVICE

This application is a continuation of application Ser. No. 741,942 filed June 6, 1985 now abandoned.

This invention relates to a buried channel charge coupled device, and more particularly to a buried channel charge coupled device capable of draining excess charges into a substrate.

Recently, charge coupled devices (hereinafter, abbreviated to CCDs) have improved remarkably due to improved semiconductor integrated circuit structures and manufacturing technique. Particularly, a buried channel CCD has been widely used in solid-state imaging devices and analog delay lines because of high quality CCDs having a high transfer efficiency.

The buried channel CCD, however, has the disadvantage that it is extremely insufficient where maximum signal charges are to be processed as compared to a conventional surface channel CCD. When applied as an imaging device, this causes a blooming phenomenon wherein a great amount of photogenerated charges under strong illumination can not be accumulated in a predetermined potential well of the buried channel CCD and are diffused. To suppress the blooming phenomenon, prior art devices provided an overflow drain in a photosensitive area whereby the photosensitive excess charges under strong illumination are absorbed in the overflow drain.

Such a conventional buried channel CCD, however, has the disadvantage that since the overflow drain for absorbing the excess charges is provided within a device plane, it is not well suited for the construction of a high density device.

It is, therefore, an object of this invention to provide a high density type buried channel charge coupled device capable of suppressing a blooming phenomenon.

According to this invention, a buried channel charge coupled device is formed on a semiconductor substrate having one conductivity and formed in a semiconductor having another conductivity. A three-level pulse having, at different time points, first to third levels is used as a driving pulse to be applied to a transfer electrode. In at least one part of the time period in a charge transfer period and a charge integration period, the first level or the second level portion of the three-level pulse is applied to the transfer electrode so that part of signal charges in the buried channel are drained through the semiconductor area into the semiconductor substrate. In the charge transfer period, the second level and the third level portions of the three-level pulse are alternately applied to the transfer electrode.

The features and advantages of this invention will be understood from the following detailed description of preferred embodiments of this invention, taken in conjunction with the accompanyings, in which.

First, a conventional buried channel CCD will be described with reference to FIG. 1.

Figure 1:
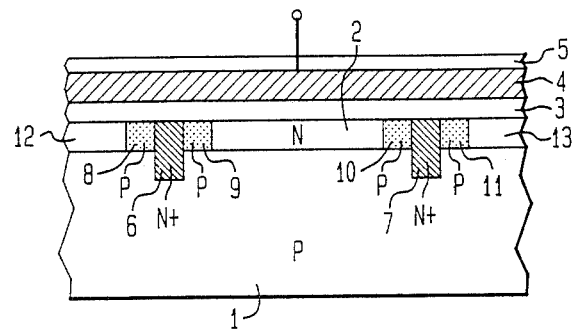
FIG. 1 is a cross-sectional view of a conventional buried channel CCD.

Referring to FIG. 1, a conventional imaging device comprises a P-type semiconductor substrate 1, N-type semiconductor areas 2 12, and 13 constituting buried channel CCD elements or charge transfer channels, insulating layers 3 and 5, a transfer electrode 4, overflow drains 6 and 7 constituted by N-type diffusion layers, and P-type semiconductor areas 8 to 11 constituting overflow control gates together with the transfer electrode. The overflow drains 6 and 7 are applied with a reverse biased voltage to the P-type substrate 1.

Photogenerated excess signal charges (electrons) are transferred from the N-type areas in the buried channel CCD elements (2, 12 and 13) through the P-type areas (8 to 11) into the overflow drains (6 and 7). Thus, the excess signal charges are absorbed in the overflow drains without leaking in adjacent channels and without overflowing under adjacent electrodes.

However, since the overflow drain is provided within the plane of the CCD elements, it is not well suited for the construction of a high density device.

Figure 4:
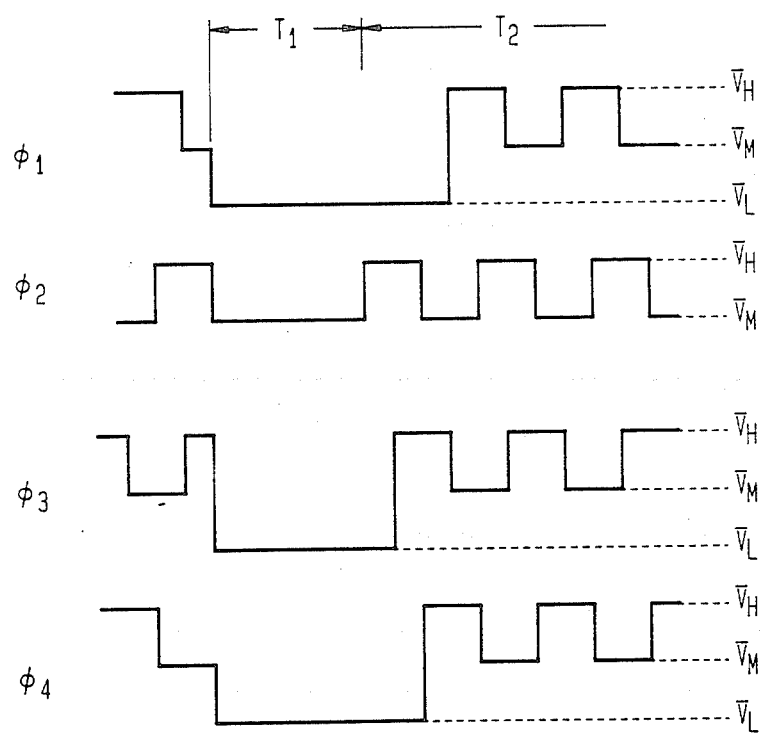
FIG. 4 shows driving pulses to be applied to the embodiment.
Figure 2:
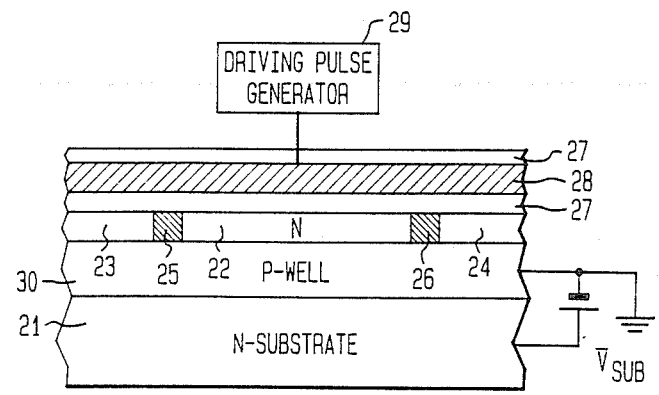
FIG. 2 is a cross-sectional view of an embodiment of this invention in a direction perpendicular to a charge transfer direction.
Figure 3:
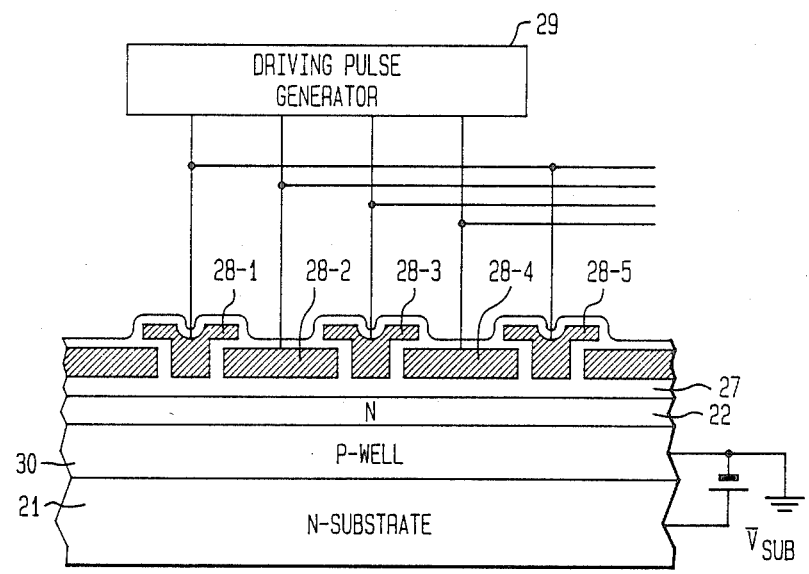
FIG. 3 is a cross-sectional view of the embodiment in the charge transfer direction.

Referring to FIGS. 2 and 3, an embodiment of this invention comprises an N-type substrate 21, a P-well 30, N-type semiconductor areas 22, 23 and 24 constituting buried channel CCDs, channel stoppers 25 and 26, insulating layers 27, transfer electrodes 28 (28-1, 28-2, 28-3, 28-4, 28-5, etc.), and a driving pulse generator 29 for generating three-level driving pulses $\phi_1$, to $\phi_4$ as shown in FIG. 4. Each of the three-level driving pulses $\phi_1$ to $\phi_4$ has lowest, middle and highest levels $V_L$, $V_M$ and $V_H$ at different time points. The driving pulse $\phi_1$ is applied to the transfer electrodes 28-1, 28-5, - - - ; the driving pulse $\phi_2$ to the transfer electrodes 28-2, 28-6 (not shown), - - - ; the driving pulse $\phi_3$ to the transfer electrodes 28-3, 28-7 (not shown), - - - ; and the driving pulse $\phi_4$ to the transfer electrodes 28-4, 28-8 (not shown), - - - . A reverse biased voltage $V_{SUB}$ is applied between the P-well 30 and the N-type substrate 21.

Figure 5:
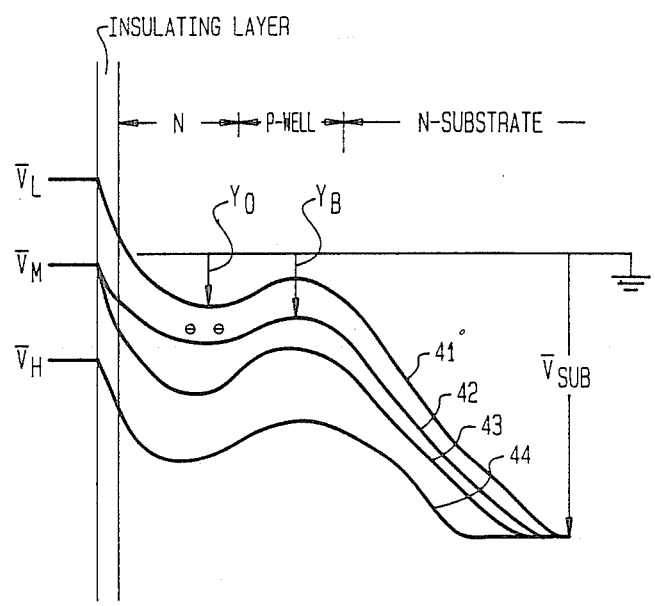
FIG. 5 shows potential profiles in the the embodiment.

An operation of the embodiment will be described with reference to FIG. 4 in which symbols $T_1$ and $T_2$ stand for the charge integration and charge transfer periods, respectively. It is assumed that the signal charges are accumulated under the transfer electrode 28-2 which is applied with the driving pulse $\phi_2$. In the charge integration period $T_1$, the driving pulse $\phi_2$ is held at the middle level $V_M$, and the other driving pulses $\phi_1$, $\phi_3$ and $\phi_4$ are held at the lowest level $V_L$. The potential profile under the electrode 28-2 in case of no signal charges being accumulated is shown by a characteristic curve 43 (FIG. 5) and the potential profiles under the barrier electrodes 28-1, 28-3 and 28-4 is shown by a characteristic curve 41. As the photogenerated signal charges are accumulated, the potential profile under the electrode 28-2 changes to a profile shown by a characteristic curve 42. Simultaneously, part of the excess charges are drained into the substrate. Then, the potential variance is stopped when the charges generated by the photogeneration and the charges drained into the substrate are balanced with each other. The minimum potential $\phi_B$ of the P-well at this time is higher than the maximum potential $\phi_O$ of the buried channel CCD under the barrier electrode and all the excess charges are drained into the substrate without flowing under the adjacent electrodes, thereby to suppress the blooming phenomenon.

In the charge transfer period $T_2$, the driving pulses $\phi_1$ to $\phi_4$ having alternately the highest level $V_H$ and the middle level $V_M$, as shown in FIG. 4, are applied to the transfer electrodes 28, thereby to perform the charge transfer. The potential profiles in the device are deep as shown by the characteristic curves 42 and 43 and 44, and the potential difference between the buried channel CCDs and the P-well is great, whereby the signal charges being tranferred are not drained into the substrate.

As described above, according to this invention, it is possible to suppress the blooming phenomenon without providing the overflow drain.

The above description has been made with reference to the case where the charges are accumulated under the transfer electrode 28-2 applied with the driving pulse $\phi_2$ in the charge integration period. Further, it is possible to accumulate the charges under the transfer electrodes 28-2 and 28-3 applied with the driving pulses $\phi_2$ and $\phi_3$ by holding the driving pulses $\phi_2$ and $\phi_3$ at the middle level $V_M$.

Furthermore, this invention is applicable to not only the illustrated 4-phase driving system but also to a 2-phase or a 3-phase driving system.

What is claimed is:

1. A buried channel charge coupled device (CCD) wherein buried CCD elements are disposed on a semiconductor substrate having one conductivity and disposed in a semiconductor area having a conductivity reverse to that of said semiconductor substrate; transfer electrodes disposed in said CCD for receiving three-level driving pulses wherein the pulses are applied to each of said electrodes, each pulse has, at different time points, first, second and third voltage levels, and the first voltage level is applied to selected ones of the transfer electrodes with the second voltage level applied to selected other ones of the transfer electrodes during at least one part of a time period in a charge transfer period and a charge integration period so that part of signal charges in the buried channel are drained through said semiconductor area into said semiconductor substrate, and said second and third voltage levels are alternately applied to said transfer electrodes during the charge transfer period.

2. A buried channel CCD as set forth in claim 1, wherein said semiconductor area is a P-type material forming a P-well, said CCD elements are N-type material and said semiconductor substrate is an N-type material.

3. A buried channel CCD as set forth in claim 2, wherein means are provided for providing a reverse biased voltage between said P-well and said semiconductor substrate.

4. A buried channel CCD as set forth in claim 1, wherein said three level pulses are applied to the transfer electrodes in a four-phase driving system.

5. A buried channel CCD as set forth in claim 4 wherein the second-phase of the four-phase driving pulse system is a two level driving pulse and the remaining phases are three-level driving pulses.

6. A method of suppressing blooming phenomenon in a buried channel charge coupled device (CCD) having buried channel CCD elements in a semiconductor area which has a conductivity reverse to that of a semiconductor substrate beneath the semiconductor area and having a plurality of transfer electrodes in the CCD, comprising the steps of:

accumulating signal charges in the CCD elements;

applying a driving pulse having a first voltage level to selected ones of said transfer electrodes and a driving pulse having a second voltage level to selected other ones of said transfer electrodes during part of a time period in a charge integration period so that part of said signal charges in the CCD elements are drained through said semiconductor area into said semiconductor substrate; and subsequently applying driving pulses alternating between the second voltage level and a third voltage level to said transfer electrodes during a charge transfer period.

7. A method as set forth in claim 6, and further including the step of applying the driving pulses according to a four-phase system to said transfer electrodes.

* * * * *